United States Patent
Deeben et al.

(10) Patent No.: US 8,262,257 B2
(45) Date of Patent: Sep. 11, 2012

(54) ILLUMINATION DEVICE WITH LED WITH A SELF-SUPPORTING GRID CONTAINING LUMINESCENT MATERIAL AND METHOD OF MAKING THE SELF-SUPPORTING GRID

(75) Inventors: Josephus Paulus Augustinus Deeben, Eindhoven (NL); Rene Jan Hendriks, Eindhoven (NL); Marcellus Jacobus Johannes Van Der Lubbe, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 144 days.

(21) Appl. No.: 12/990,652

(22) PCT Filed: May 4, 2009

(86) PCT No.: PCT/IB2009/051816
§ 371 (c)(1),
(2), (4) Date: Nov. 2, 2010

(87) PCT Pub. No.: WO2009/136351
PCT Pub. Date: Nov. 12, 2009

(65) Prior Publication Data
US 2011/0044026 A1 Feb. 24, 2011

(30) Foreign Application Priority Data

May 7, 2008 (EP) .................................... 08155754

(51) Int. Cl.
*F21S 4/00* (2006.01)
*F21V 21/00* (2006.01)

(52) U.S. Cl. ............... 362/249.02; 362/311.02; 362/800
(58) Field of Classification Search ............. 362/249.02, 362/311.02, 800
See application file for complete search history.

(56) References Cited

U.S. PATENT DOCUMENTS

| 7,196,354 B1 | 3/2007 | Erchak et al. |
| 2005/0269582 A1 | 12/2005 | Mueller et al. |
| 2007/0080362 A1 | 4/2007 | Scotch et al. |

FOREIGN PATENT DOCUMENTS

| EP | 1198016 A2 | 4/2002 |
| EP | 1566426 A2 | 8/2005 |
| EP | 1681728 A1 | 7/2006 |
| EP | 1876387 A1 | 1/2008 |
| WO | 2007052777 A1 | 5/2007 |

*Primary Examiner* — Jason Moon Han
(74) *Attorney, Agent, or Firm* — Mark L. Beloborodov

(57) ABSTRACT

The invention provides an illumination device (10) comprising (a) a light emitting diode (LED), (b) a heat sink (85) and (c) a self-supporting grid (500). This grid (500) is arranged downstream of the LED (20) and arranged so as to be in contact with the heat sink 85. The self-supporting grid (500) comprises a plurality of grid structures (501) and a plurality of grid openings 502) between the grid structures (501). At least part of the total number of grid openings (502) encloses luminescent material (51), thereby providing luminescent material-filled grid openings (551). The luminescent material (51) is arranged to absorb at least part of the LED emission (21) and emit luminescent material emission (13). The LED (20) and the luminescent material (51) are arranged to provide light (115) of a predetermined color downstream of the self-supporting grid (500).

9 Claims, 5 Drawing Sheets

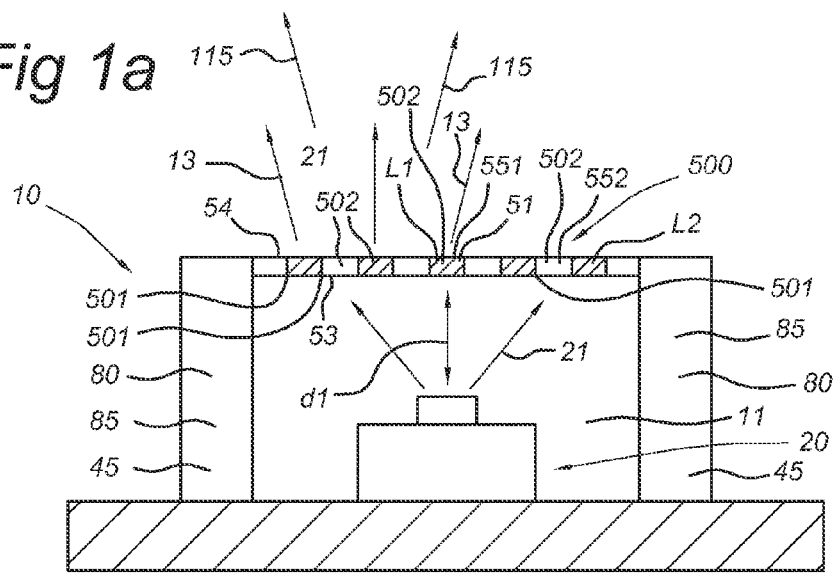
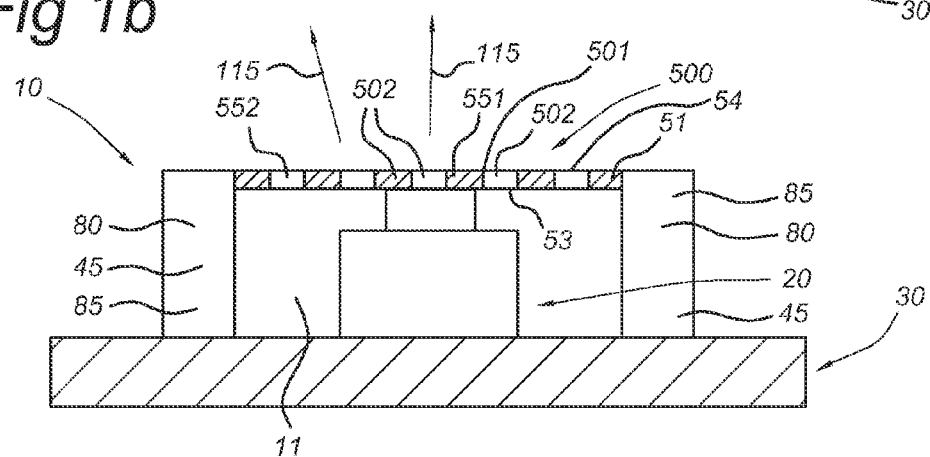
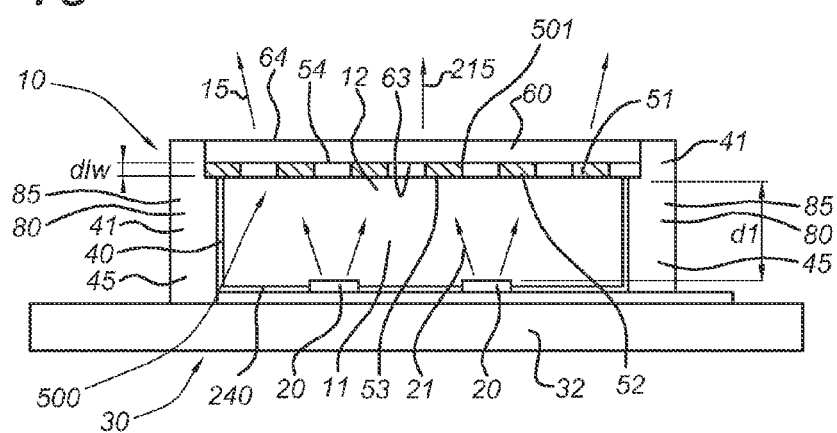

ILLUMINATION DEVICE WITH LED WITH A SELF-SUPPORTING GRID CONTAINING LUMINESCENT MATERIAL AND METHOD OF MAKING THE SELF-SUPPORTING GRID

FIELD OF THE INVENTION

The invention relates to an illumination device with a self-supporting grid containing luminescent material, as well as to a method of making such a self-supporting grid containing the luminescent material.

BACKGROUND OF THE INVENTION

Illumination devices comprising luminescent material for converting LED light are known in the art. Transmissive ceramic layers or luminescent ceramics, which can be used for such applications, and the method of preparation thereof, are also known in the art. Reference is for instance made to US 2005/0269582, which discloses a semiconductor light emitting device combined with a ceramic layer which is disposed in a path of light emitted by a light emitting layer. The ceramic layer is composed of or includes a wavelength-converting material such as a luminescent material.

U.S. Pat. No. 7,196,354 discloses another type of device, which comprises a light-generating region adapted to generate light, a wavelength-converting region, and a thermally conductive region. The wavelength-converting region is capable of absorbing light generated by the light-generating region and emitting light having a different wavelength than a wavelength of the light generated by the light-generating region. The thermally conductive region is in contact with the wavelength-converting region and is capable of conducting heat generated in the wavelength-converting region. The thermally conductive region comprises a material having a thermal conductivity greater than a thermal conductivity of the wavelength-converting region. The light-emitting device is adapted to emit light having a total power greater than 0.5 Watts. The thermally conductive region is in contact with a heat sink.

SUMMARY OF THE INVENTION

A disadvantage of some of the prior art systems may be that heat cannot easily be dissipated. This implies that high-power devices may not be constructed since thermo-sensible luminescent materials and/or organic substrates may be damaged by the high intensity of the radiation (and concomitant heat development, for instance due to Stokes-shift losses).

A further disadvantage of some of the prior art systems is the complex structure or the use of relatively bulky optics, which may not only have a detrimental effect on efficiency, but may also prevent the construction of small devices.

Other disadvantages of some of the prior art systems may be that relatively expensive and/or difficult to produce (transmissive) materials have to be applied.

Hence, it is an aspect of the invention to provide an alternative illumination device, which preferably further obviates one or more of the above-described drawbacks. It is further an aspect of the invention to provide a device with an improved efficiency.

In a first aspect, the invention provides an illumination device comprising:
a. a light emitting diode (LED) arranged to emit LED emission;
b. a heat sink;
c. a self-supporting grid arranged downstream of the LED and arranged so as to be in contact with the heat sink, wherein the self-supporting grid comprises a plurality of grid structures and a plurality of grid openings between the grid structures, wherein at least part of the total number of grid openings enclose luminescent material, thereby providing luminescent material-filled grid openings, wherein the luminescent material is arranged to absorb at least part of the LED emission and emit luminescent material emission, and wherein the LED and the luminescent material are arranged to provide light of a predetermined color downstream of the self-supporting grid.

Advantageously, an alternative device is provided hereby. Heat generated in the luminescent material may relatively easily be dissipated, which may improve the life time of the luminescent material and/or of other materials like for instance organic materials (for instance a binder, substrates etc., if present), and/or which may allow the use of higher-power devices, and/or which may also provide a more stable color point during operation.

The heat sink especially is an object that absorbs and dissipates heat from the luminescent material and/or grid. Especially, the grid is in thermal contact with the heat sink, thereby allowing heat to dissipate via the grid to the heat sink. The term "in contact" therefore relates to thermal contact, which is especially physical contact. For instance, part of the grid may be in contact with, or even integrated in, the heat sink. In an embodiment, at least part of the chamber wall (see below) may be a heat sink. Hence, in an embodiment, (part of) the heat sink is arranged as chamber wall.

Heat sinks function by efficiently transferring thermal energy ("heat") from an object (first object) at a high(er) temperature to another object (second object) at a lower temperature with a greater heat capacity. This rapid transfer of thermal energy quickly brings the first object into thermal equilibrium with the second, lowering the temperature of the first object, and fulfilling the heat sink's role as a cooling device. Efficient functioning of a heat sink relies on rapid transfer of thermal energy from the first object to the heat sink, and from the heat sink to the second object.

The most common design of a heat sink is a metal device with many fins. The high thermal conductivity of the metal combined with its large surface area result in the rapid transfer of thermal energy to the surrounding, cooler, air. This cools the heat sink and whatever it is in direct thermal contact with. Heat sinks are known to the person skilled in the art.

The grid comprises grid structures, such as wires or plates, especially wires, which build up the grid. The grid may comprise a 1-dimensional grid, a 2-dimensional grid or a 3 dimensional grid. The grid structures may be arranged in an ordered way or in a disordered way, or in a combination thereof. In general, the grid structures will have dimensions like thickness, diameter or height in the range of about 0.01-2 mm, especially in the range of about 0.02-1 mm, even more especially in the range of about 0.02-0.5 mm.

The term "grid" as used herein refers to the "self-supporting grid". In general, it especially refers to the self-supporting grid containing the luminescent material, unless indicated otherwise. The terms "self-supporting grid containing the luminescent material" or "self-supporting grid comprising luminescent material" and similar terms especially refer to self-supporting grids wherein one or more of the grid openings enclose luminescent material. Note that when a grid opening encloses luminescent material, the grid opening will in general be effectively "closed", since it is filled with luminescent material. Such openings are indicated as "luminescent material-filled grid opening".

The term "self-supporting" is known to the person skilled in the art. It refers to structures which do not need further supports, carriers, substrates to substantially maintain their shape. Especially, the grid has a Young's modulus (E) in GPa of at least about 0.5 GPa, more especially at least about 1 GPA, even more especially at least about 1 GPa, yet even more especially at least about 5 Gpa, yet even more especially at least about 10 GPa, yet more especially at least about 20 GPa. The fact that the grid is called a self-supporting grid does not exclude the use of supports to support the grid. The grid may comprise a frame enclosing the grid structures; the grid structures may be bound together by the frame.

In a specific embodiment, the grid comprises a 1D self-supporting grid. In such a grid, the grid structures may be arranged substantially parallel to each other. The grid openings, between the grid structures, may therefore also be arranged substantially parallel.

In another embodiment, the grid comprises a 2D self-supporting grid. Here, the grid structures provide a matrix of grid openings. Such grid openings may be regularly or irregularly shaped. The grid openings may be substantially round, or square, or rectangular, or hexagonal, etc. Combinations of one or more of such shapes of grid openings may also be applied. One or more of the grid openings enclose luminescent material.

In another embodiment, the grid comprises a 3D grid. Here, the grid structures provide a 3D matrix of grid openings. Such grid openings may be regularly or irregularly shaped. For instance, in an embodiment, steel wool or similar irregular structures, may be applied. In general, 1D or 2D grids are preferred, with preferably an ordered distribution of the grid structures, although this does not exclude an inhomogeneous distribution of the grid structures over the grid (see below).

The grid openings preferably have dimensions (length/width or diameter) in the range of about 0.1-4 mm, especially in the range of about 0.5-2 mm. The luminescent material enclosed by the grid may have a thickness (medial thickness) in the range of about 0.01-2 mm, especially in the range of about 0.02-0.5 mm.

In a specific embodiment, the grid structures are substantially homogeneously distributed over the self-supporting grid. This implies a regular and repeating pattern of grid structures and grid openings with a substantially constant period. However, the grid structures (and thus the grid openings) may also be inhomogeneously distributed over the grid. Especially, it may be of interest to concentrate grid structures at locations where the thermal load is relatively high, rather than at locations where the thermal load is relatively low. For instance, at locations where the illumination intensity is relatively high, also the generation of heat will be relatively high. Hence, a concentration of grid structures, and thus the promotion of heat dissipation to the heat sink, at locations where the illumination intensity is relatively high, may be worthwhile.

Hence, in a specific embodiment of the illumination device, the self-supporting grid has a mean grid pattern density (MPD) defined as the mean number of grid openings per square mm, wherein the intensity of LED emission received by the self-supporting grid is inhomogeneously distributed over the self-supporting grid, and wherein the self-supporting grid is arranged to provide a local grid pattern density (LPD) that is larger than the mean grid pattern density (MPD) at a high intensity location where the self-supporting grid receives a relatively high intensity of LED emission, and is arranged to provide a local grid pattern density (LPD) that is smaller than the mean grid pattern density (MPD) at a low intensity location where the self-supporting grid receives a relatively low intensity of LED emission.

In an embodiment, the self-supporting grid comprises a regular pattern of luminescent material-filled grid openings and substantially non-filled grid openings. An advantage of using filled and non-filled grid openings may be that the grid openings that are filled may be designed to optimally direct LED emission in the desired direction, i.e. downstream of the grid, whereas the non-filled grid openings allow LED emission to pass substantially unhindered through the grid. The transmitted (blue) LED light and the luminescent light downstream of the LED may provide the light of the predetermined color. Nevertheless, in an embodiment, the filled grid openings may also be designed to allow at least part of the LED emission to pass through the luminescent material.

Here, the term "filled grid opening" refers to the luminescent material-filled grid opening. The term "luminescent material-filled grid opening" also includes grid openings filled with a combination of luminescent material and (hardened or dried) binder material.

In yet another embodiment, substantially all grid openings are luminescent material-filled grid openings. This implies that substantially all LED emission is intercepted by luminescent material-filled grid openings. Depending upon the desired predetermined color, all or part of the LED emission may be converted by the luminescent material in the grid.

Preferably, the grid, i.e. especially the grid structures, comprise a material that allows a good thermal conductivity. Preferred materials may for instance be selected from the group consisting of aluminum, gold, copper, silver, carbon, and carbon nanotubes, especially copper. Other suitable materials may be selected from the group consisting of molybdenum, tungsten, rhodium and iridium. In a specific embodiment, the grid structures comprise a material having a thermal conductivity of at least 100 $Wm^{-1}K^{-1}$ at 300 K, more especially at least 250 $Wm^{-1}K^{-1}$. The frame may comprise the same material as the grid structures and/or has (also) a thermal conductivity of at least 100 $Wm^{-1}K^{-1}$ at 300 K, more especially at least 250 $Wm^{-1}K^{-1}$. Likewise, the heat sink may also comprise one (or more) of the above mentioned materials for the grid structures.

In an embodiment, the LED(s) and the self-supporting grid have a shortest LED-to-self-supporting grid distance (d1) between the LED(s) and the self-supporting grid in the range of about 0-100 mm. Hence, in an embodiment, the self-supporting grid (including the luminescent material) may be in physical contact with the LED (i.e. d1≈0 mm).

Herein, the invention is described with respect to one self-supporting grid with luminescent material. However, the device according to the invention may in an embodiment also comprise a plurality of such grids, for instance 2 or 3 (arranged downstream of each other, respectively). The invention is however further described with reference to one grid arranged downstream of the LED(s).

Further, also a plurality of grids may be applied in substantially the same plane, for instance when large devices are applied. Hence, the term grid may also refer to a plurality of grids.

The self-supporting grid may in an embodiment have a substantially flat shape, like a plate, but may in another embodiment have a substantially convex shape, like for instance a dome.

In a specific embodiment, an exit window is applied, that may be arranged to further diffuse the light and/or to create a mixing chamber. In this way, it may also be avoided that a user can directly observe the self-supporting grid, which may comprise colored luminescent material. In general, consumers prefer a white appearance (in the off state) of the exit window. Hence, in an embodiment, the illumination device further comprises (d) a translucent exit window, downstream of the self-supporting grid, arranged to transmit at least part of the light.

The self-supporting grid containing luminescent material may be produced in a number of ways. Grids may be commercially available or may be provided especially for the application of the invention. The person skilled in the art knows how to produce such grids. There are a number of ways, however, to fill the grid openings with luminescent material. For instance, the self-supporting grid may be contacted (like dipping) with a paste comprising luminescent material and a binder and then the grid thus obtained may be heated to obtain the grid with luminescent material-filled grid openings. Instead of contacting with a paste, it may also be possible to use a printer and fill the openings, which may allow the creation of regular patterns of grid openings filled and unfilled with luminescent material, as describe above. In a specific embodiment, the invention provides a method of manufacturing the self-supporting grid containing luminescent material, wherein the method comprises:
a. providing the self-supporting grid comprising the plurality of grid structures and the plurality of grid openings between the grid structures;
b. providing a sieve with a plurality of predetermined sieve openings, wherein the sieve is arrangeable over the self-supporting grid;
c. guiding a paste comprising luminescent material and optionally a binder through the plurality of predetermined sieve openings and filling predetermined grid openings;
d. heating the self-supporting grid with the paste-filled predetermined grid openings, thereby providing the self-supporting grid with luminescent material-filled grid openings.

According to yet a further aspect, the invention provides a self-supporting grid containing luminescent material, such as obtainable by the method of making the self-supporting grid containing luminescent material, as described herein.

In this way, advantageously, an alternative illumination device is provided. Further, advantageously, the device efficiency may in an embodiment be higher than that of conventional illumination devices (such as those comprising a luminescent material layer, coating, or ceramic and the like). Also, an improved life time of the luminescent material may be obtained in an embodiment. Further, an embodiment of the device of the invention may allow higher-power devices. In addition, the alternative device according to the invention may in an embodiment also have a more stable color point during operation, in comparison to state of the art devices With the proposed illumination device, wherein an exit window is applied, the lamp may look white especially when it is in the off-state or illuminated with white light. Other advantages, especially relative to systems wherein the luminescent material is provided on the LED, may be that an intrinsically efficient system (less back reflection/reabsorption) may be provided and that a warm white option (without substantial thermal quenching and with a relatively "low" irradiation of the luminescent material) may be provided. Further, the illumination device according to the invention is a relatively simple concept (may be based on blue LEDs only, which has the advantage of relatively easy assembly and driving) and, in addition, the option of an adjustable color temperature is feasible.

Remote luminescent material in LED based light sources seems to be very advantageous with respect to system efficacy, in particular for the generation of light with a low color temperature (warm white). Applying the luminescent material-containing grid as described herein may result in high system efficacy, because only little light is reflected back into the LED where it has a rather high chance of being absorbed. Using the luminescent material remote from the LEDs can result in efficacy gains up to about 50% compared to systems with luminescent material in the LED package.

Applying a luminescent material layer at the surface, especially the emitting surface (i.e. downstream surface), of an exit window may result in a rather saturated color point of that surface when the lamp is off or when said surface is illuminated with white light. The degree of saturation of the appearing color of the exit window can be reduced by applying, according to the invention, the luminescent material coating on (and/or in) a transmissive carrier located in between the LEDs and a diffusive, translucent material exit window of the illumination device.

The translucent exit window may act as the virtual emission window (for the further optical system, where the light may be further manipulated for e.g. beam shaping). With an increasing distance between the luminescent material (layer) and the translucent exit window, the saturation of the color of the translucent exit window may be further reduced. Typically, the saturation can be reduced from about 62% to about 50% by separating the luminescent material layer from the translucent exit window with almost zero spacing in between, and can be further reduced to less than about 20% by increasing the spacing.

Some of the measures listed above and hereinbelow may be based amongst others on applying additional scattering or reflection in the system. Surprisingly, however, the system efficiency is almost preserved, while in general the addition of more scattering and of more (partly) reflective surfaces in a system cause a very significant reduction of the system efficiency.

LED and Luminescent Material

In an embodiment, the LED is arranged to emit blue emission and the luminescent material comprises (a) a green luminescent material, arranged to absorb at least part of the blue LED emission and to emit green emission, and (b) a red luminescent material, arranged to absorb at least part of the blue LED emission, or at least part of the green emission, or both at least part of the blue emission and at least part of the green emission and to emit red emission. In this way, the light of a predetermined color may be white light. Depending upon amongst others LED power, the blue LED emission spectrum, and the amounts of luminescent material, white light of different color temperatures may be composed.

In another embodiment, the LED is arranged to emit blue emission and the luminescent material comprises (a) a yellow luminescent material, arranged to absorb at least part of the blue emission and to emit yellow emission, and optionally (b) one or more other luminescent materials, arranged to absorb at least part of the blue LED emission, or at least part of the yellow emission, or both at least part of the blue emission and at least part of the yellow emission, and to emit emission at an emission wavelength different from the yellow emission. Also in this way, the light of a predetermined color may be white light. Depending upon amongst others the blue LED emission spectrum, LED power and the amounts of luminescent material, white light of different color temperatures may be composed. In a specific embodiment, the luminescent material, in addition to the yellow luminescent material (a) further comprises (b) a red luminescent material, arranged to absorb at least part of the blue LED emission, or at least part of the yellow emission, or both at least part of the blue emission and at least part of the yellow emission and to emit red emission. This red luminescent material may amongst others be applied to further improve the CRI.

Hence, the device according to the invention may be arranged to provide light of a predetermined color, wherein the light is colored light or white light. In an embodiment, the illumination device comprises a plurality of light emitting diodes (LEDs), such as in the order of 2-100, like 4-64, arranged to emit LED emission.

The term white light as used herein is known to the person skilled in the art. It especially relates to light having a correlated color temperature (CCT) between about 2,000 and 20,000 K, especially 2700-20,000 K, for general lighting purposes especially in the range of about 2700 K and 6500 K, and for backlighting purposes especially in the range of about 7,000 K and 20,000 K, and especially within about 15 SDCM (standard deviation of color matching) from the BBL (black body locus), especially within about 10 SDCM from the BBL, even more especially within about 5 SDCM from the BBL.

The terms "blue light" or "blue emission" especially relate to light having a wavelength in the range of about 410-490 nm. The term "green light" especially relates to light having a wavelength in the range of about 500-570 nm. The term "red light" especially relates to light having a wavelength in the range of about 590-6500 nm. The term "yellow light" especially relates to light having a wavelength in the range of about 560-590 nm.

These terms do not exclude that especially the luminescent material may have a broadband emission with (a) wavelength(s) outside the range of for instance about 500-570 nm, about 590-6500 nm, and about 560-590 nm, respectively. However, the dominant wavelength of emissions of such luminescent materials (or of the LED) will be found within the ranges given herein. Hence, the phrase "with a wavelength in the range of" especially indicates that the emission may have a dominant emission wavelength within the specified range.

Especially preferred luminescent materials are selected from garnets and nitrides, especially doped with trivalent cerium or divalent europium, respectively. Embodiments of garnets especially include $A_3B_5O_{12}$ garnets, wherein A comprises at least yttrium or lutetium and wherein B comprises at least aluminium. Such garnets may be doped with cerium (Ce), with praseodymium (Pr) or a combination of cerium and praseodymium; especially however with Ce. Especially, B comprises aluminium (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1.

The term ":Ce" indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This notation is known to the person skilled in the art. Ce will replace A in general for not more than 10%; in general, the Ce concentration will be in the range of 0.1-4%, especially 0.1-2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

The red luminescent material may in an embodiment comprise one or more materials selected from the group consisting of (Ba,Sr,Ca)S:Eu, (Ba,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation, particularly in a range of about 0.5-10%, and more particularly in a range of about 0.5-5% relative to the cation(s) it replaces. The term ":Eu" indicates that part of the metal ions is replaced by Eu (in these examples by Eu$^{2+}$). For instance, assuming 2% Eu in CaAlSiN$_3$:Eu, the correct formula could be $(Ca_{0.98}Eu_{0.02})$AlSiN$_3$. Divalent europium will in general replace divalent cations, such as the above divalent alkaline earth cations, especially Ca, Sr or Ba.

The material (Ba,Sr,Ca)S:Eu can also be indicated as MS:Eu, wherein M is one or more of the elements selected from the group consisting of barium (Ba), strontium (Sr) and calcium (Ca); in particular, M comprises in this compound calcium or strontium, or calcium and strontium, more particularly calcium. Here, Eu is introduced and replaces at least part of M (i.e. one or more of Ba, Sr, and Ca).

Further, the material (Ba,Sr,Ca)$_2$Si$_5$N$_8$:Eu can also be indicated as M$_2$Si$_5$N$_8$:Eu, wherein M is one or more of the elements selected from the group consisting of barium (Ba), strontium (Sr) and calcium (Ca); in particular, M comprises in this compound Sr and/or Ba. In a further specific embodiment, M consists of Sr and/or Ba (not taking into account the presence of Eu), in particular 50-100%, especially 50-90% Ba and 50-0%, in particular 50-10%, Sr, such as Ba$_{1.5}$Sr$_{0.5}$Si$_5$N$_8$:Eu (i.e. 75% Ba; 25% Sr). Here, Eu is introduced and replaces at least part of M (i.e. one or more of Ba, Sr, and Ca).

Likewise, the material (Ba,Sr,Ca)AlSiN$_3$:Eu can also be indicated as MAlSiN$_3$:Eu, wherein M is one or more of the elements selected from the group consisting of barium (Ba), strontium (Sr) and calcium (Ca); in particular, M comprises in this compound calcium or strontium, or calcium and strontium, more in particular calcium. Here, Eu is introduced and replaces at least part of M (i.e. one or more of Ba, Sr, and Ca).

The term luminescent material used herein especially relates to inorganic luminescent materials, which are also sometimes indicated as phosphors. These terms are known to the person skilled in the art.

Combinations of 2 or more different luminescent materials may be applied; the term "luminescent material" may also refer to a combination of luminescent materials.

Translucent Exit Window

Especially at a non-zero distance from the self-supporting grid and downstream of this support, a translucent exit window may be arranged. This exit window is arranged to allow illumination device light to escape from the illumination device.

The translucent exit window may have a substantially flat shape, like a plate, but may in another embodiment have a substantially convex shape, like for instance a dome.

The translucent exit window may in an embodiment comprise an organic material. Preferred organic materials are selected from the group consisting of PET (polyethylene terephthalate), PE (polyethylene), PP (polypropylene), PC (polycarbonate), P(M)MA (poly(methyl)metacrylate), PEN (polyethylene napthalate), PDMS (polydimethylsiloxane), and COC (cyclo olefin copolymer).

However, in another embodiment the translucent exit window comprises an inorganic material. Preferred inorganic materials are selected from the group consisting of glasses, (fused) quartz, ceramics, and silicones.

The exit window however is preferably translucent. For instance, the above mentioned materials may have intrinsic translucent properties or may be made translucent (for instance by frosting (for instance by sand blasting or acid etching, also known as "frosting") the material). Such methods are known in the art. The translucent exit window may allow some light to pass through, but the interior (i.e. objects of the illumination device, upstream of the exit window) seen through translucent material is substantially diffused or indistinct.

Illumination Device

Relative to the LED(s) the self-supporting grid is arranged downstream of the LED(s). The self-supporting grid is preferably arranged in such a way that substantially all emission generated by the LED(s) is directed in the direction of the self-supporting grid, i.e. the self-supporting grid is disposed in a path of light emitted by the LED(s). Hence, in a preferred embodiment, the self-supporting grid (including the luminescent material) receive substantially all LED emission. Since in an embodiment the distance between the self-supporting grid (thus also luminescent material) and the LED is non-zero, there may be an LED chamber or LED cavity, enclosed by an LED support supporting the LED(s), the self-supporting grid and optionally LED cavity walls. The self-supporting grid (thus also luminescent material) may receive substantially all LED emission after internal reflection in the LED chamber or LED cavity.

The self-supporting grid (including the luminescent material) is especially arranged to transmit at least part of the LED emission. In this way, the LED, with LED emission transmitted by the self-supporting grid (including the luminescent material) and the luminescent material with luminescent material emission are arranged to generate light of a predetermined color (such as white light).

The optional translucent exit window is arranged downstream of the self-supporting grid (including the luminescent material). Hence, the self-supporting grid (including the luminescent material) has an upstream face directed to the LED(s) and a downstream face (directed to the translucent exit window); the translucent exit window has an upstream face directed to the downstream face of the self-supporting grid (including the luminescent material) and a downstream face, directed outward of the illumination device.

Since in an embodiment the distance between the self-supporting grid and the exit window is non-zero, there may be an(other) internal chamber or diffuser cavity (herein also indicated as "mixing chamber"), enclosed by the self-supporting grid, the exit window, and optionally diffuser cavity walls, and optionally the LED support, and optionally the LED cavity walls.

As mentioned above, this exit window is arranged to allow light to escape from the illumination device. However, further optics are not excluded, such as collimators, reflectors, light guides, optical layers etc. to guide or influence the illumination device light, which may be arranged downstream of the optional exit window and downstream of the self-supporting grid.

With the invention, remote luminescent material modules and lamps can be realized that have a very high efficiency and good color rendering, and that now also can appear white or almost color-neutral when in the off-state.

The proposed configurations can be applied in large area lighting, ambiance lighting (e.g. light tiles), backlighting (e.g. poster boxes), downlighters, diffuse retrofit lamps such as incandescent (GLS) or TL replacement lamps, and wall washers and, depending on volume and beam constraints, in some spot lamps.

Optionally, the self-supporting grid may comprise a non-uniform distribution of the luminescent material (see also above and below).

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 1a-1f schematically depict a non-limiting number of possible embodiments of the illumination device of the invention in a side view.

Only the essential elements are depicted. Other elements, like drivers, power sources, further optics, like optical filters, collimators, fittings, etc., known to the person skilled in the art, are not depicted in the schematic drawings.

DESCRIPTION OF PREFERRED EMBODIMENTS

Figure 1D:
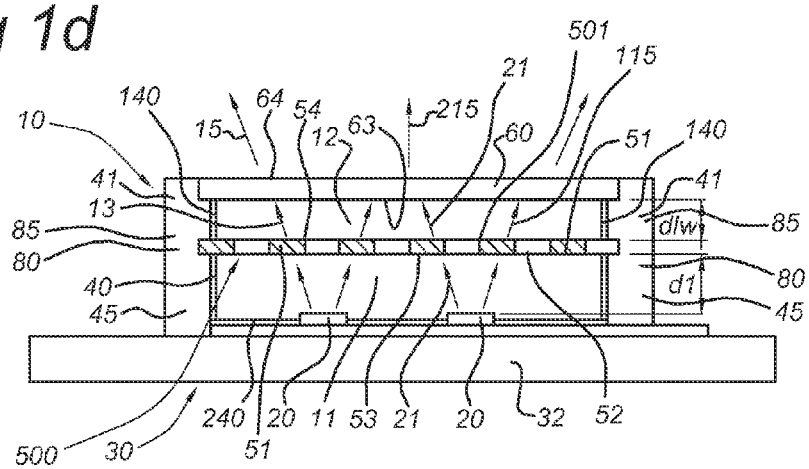

FIG. 1a (and also FIGS. 1b-1f) schematically depicts (in a side view) an illumination device 10 with (a) light emitting diode(s) 20 arranged to emit LED emission 21. Downstream from the LEDs 20, a self-supporting grid 500 is arranged, comprising luminescent material 51. By way of example, this is indicated by means of the hatched structure. The self-supporting grid 500 comprises grid openings 502 with luminescent material 51.

Figure 2A:
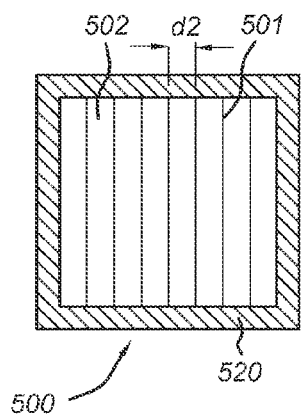
FIGS. 2a-2f schematically depict a non-limiting number of embodiments of 1D and 2D grids in a top view.

Luminescent material-filled grid openings are indicated with reference 551 and are arranged between the grid structures 501 (see FIG. 2a and subsequent Figures); non-filled grid openings are indicated with reference 552 (see FIG. 2a and subsequent Figures). At least part of the luminescent material 51 is arranged to absorb at least part of the LED emission 21 and emit luminescent material emission 13; the self-supporting grid 500 is disposed in a path of light emitted by the LED(s).

The self-supporting grid may for instance be a grid arranged between the cavity walls, which are indicated with reference 80. In the embodiments shown herein, the cavity walls 80 also have the function of heat sink. The heat sink is indicated with reference 85. The self-supporting grid 500 may for instance be a copper grid. Here, the cavity walls 80, the LED support (indicated with reference 30) and the self-supporting grid 500 provide a cavity or chamber. Here, the chamber is indicated with reference 11, and is further also indicated as LED cavity 11.

The LED emission 21 may at least partially be transmitted by the self-supporting grid 500 (including the luminescent material 51). Hence, downstream of the self-supporting grid 50, LED emission 21 and luminescent material emission 13 provide light 115 of the predetermined color. Hence, the LED(s) 20 and the luminescent material 51 are arranged to generate light 115 of a predetermined color, for instance white. For instance, LED emission 21 may be blue light and luminescent material emission 13 may be yellow light, resulting in light 115, being white light, being provided.

The self-supporting grid 500 has an upstream face or side 53 and a downstream face or side 54; the former is directed to the LEDs, the latter is directed outward (or the optional exit window, see below).

The shortest distance between the LED and the self-supporting grid is indicated with reference d1. Parts or locations of the self-supporting grid 500, or more particularly luminescent material-filled grid openings 551, which receive a relatively high intensity of the LED emission 21 are indicated with reference(s) L1; those locations which receive a relatively low intensity of the LED emission 21 are indicated with reference(s) L2. Even when light mixing in the chamber (LED chamber or LED cavity) is very satisfactory, an inhomogeneous distribution of temperatures may be found, i.e. locations with higher and lower temperatures. The illumination device according to the invention allows reduction of the temperature.

FIG. 1b schematically depicts the same embodiment as in FIG. 1a, with the exception that the distance d1 between the LED 20 and the self-supporting grid 500 is substantially 0 mm.

FIGS. 1c-1f schematically depict a number of embodiments in more detail. In those embodiments, the illumination device 10 further comprises a translucent exit window 60 arranged to transmit at least part of the light 115, thereby providing illumination device light 215. The translucent exit window 60 is especially arranged to diffuse the light 115 from the illumination device 10 (and generate illumination device light 215); the translucent exit window 60 is disposed in a path of light emitted by the luminescent material 51 and/or transmitted by the self-supporting grid 500. The translucent exit window 60 may for instance be polycarbonate (PC) that is frosted. The translucent exit window 60 has an upstream face or side 63 and a downstream face or side 64.

Here, relative to the LED(s) 20, the self-supporting grid 500 is downstream of the LED(s) 20. The shortest distance between the self-supporting grid 500 (including luminescent material 51) and LED(s) 20 is (again) indicated with reference d1. Here, d1 is larger than 0 mm. Relative to the LED(s) 20, the translucent exit window 60 is again downstream of the self-supporting grid 50. The shortest distance between the self-supporting grid 500 and the exit window 60 is indicated with reference dLW (see FIG. 1d and subsequent Figures).

In this schematic embodiment, the translucent exit window 60 has a substantially flat shape and the self-supporting grid 500 also has a substantially flat shape.

In the schematic embodiment, the illumination device 10 has a LED chamber or LED cavity 11, enclosed by an LED support 30 supporting the LED(s), the self-supporting grid 500 and LED cavity walls, indicated with reference(s) 45. The LED support 30 may comprise a (metal core) PCB (printer circuit board) and an aluminium housing 32. At least part of the interior of the LED cavity 11, especially the LED cavity walls 45 and the support 30, may be provided with a reflective material, such as a reflector. The reflector is indicated with reference number 240 on the support 30, and with reference number 40 on the LED cavity wall(s) 45.

In FIG. 1d, substantially the same embodiment as schematically depicted in FIG. 1c is depicted, however, the shortest distance between the self-supporting grid 500 and the exit window 60 (dLW) is non-zero, for instance 2-100 mm, particularly 2-20 mm. As mentioned above, the translucent exit window 60 is arranged downstream of the self-supporting grid 500 and the self-supporting grid 500 has upstream face 53 directed to the LED(s) 20 and downstream face 54 directed to the translucent exit window 60; the translucent exit window 60 has upstream face 63 directed to the downstream face 54 of the self-supporting grid 500 and a downstream face 64, directed outward of the illumination device 10.

Since, here, the distance dLW is particularly non-zero, there may be an(other) internal chamber or diffuser cavity. In the schematically depicted embodiment of FIG. 1d, this diffuser cavity is indicated with reference number 12. Here, the diffuser cavity 12 is enclosed by the self-supporting grid 50, the exit window 60 and the diffuser cavity walls 41. Hence, the cavity downstream of the LED(s) 20 and upstream of the self-supporting grid 50, i.e. the cavity between the LEDs 30 and the self-supporting grid 500, is indicated as LED cavity 11; downstream of this LED cavity 11, i.e. downstream of the self-supporting grid 500, and upstream of the translucent exit window 60, i.e. the cavity between the self-supporting grid 500 and the translucent exit window 60, is indicated as diffuser cavity 12.

In this embodiment, the diffuser cavity wall 41 of the diffuser cavity 12 is also provided with a reflector, indicated with reference 140. Hence, in an embodiment, also the diffuser cavity wall 41 comprises a reflector.

As reflector 240 on support 30, reflector 140 on diffuser cavity wall 41 and reflector 40 on LED cavity wall 45, for instance MCPET (microcellular polyethylene terephthalate) may be applied. Other reflective materials that may be used as reflector may for instance be Teflon or particulate $TiO_2$ in a matrix material. Hence, as reflectors, substantially diffuse reflectors like Teflon, MCPET (for instance from Furukawa), E60L, E6SL or E6SV (for instance from Toray), or scattering particles like $TiO_2$ in a matrix material, may be applied, or substantially specular reflectors like Norbridge (commercial name Vikuiti ESR film from 3M) or MIRO (from Alanod), may be applied, or combinations of reflectors may be applied, such as a reflector that is partially diffusely reflective and partially specularly reflective.

The LED cavity reflector 40 is especially arranged to reflect (diffusively) the LED emission 21. However, since part of the luminescent material emission 13 may also enter the LED cavity 11, the LED cavity reflector 40 may also be arranged to reflect (diffusively) luminescent material emission 13. Further, the diffuser cavity reflector 140 is especially arranged to reflect (diffusively) the luminescent material emission 13 and the LED emission 21 (transmitted by self-supporting grid 50) (i.e. light 115). In an embodiment, however, the LED 40 cavity reflector may also be arranged to reflect LED emission 21 and optionally the luminescent material emission 13, specularly.

In FIG. 1d, the entire wall 80 (i.e. here LED cavity wall 45 and diffuser cavity wall 41) is used as heat sink 85. Note that such a heat sink 85 is only schematically drawn, and may for instance further comprise fins. In FIGS. 1a-1c (and 1e) the LED cavity wall 45 is used as heat sink 85. Also parts of such (a) wall(s) may be arranged as heat sink 85.

Figure 1E:
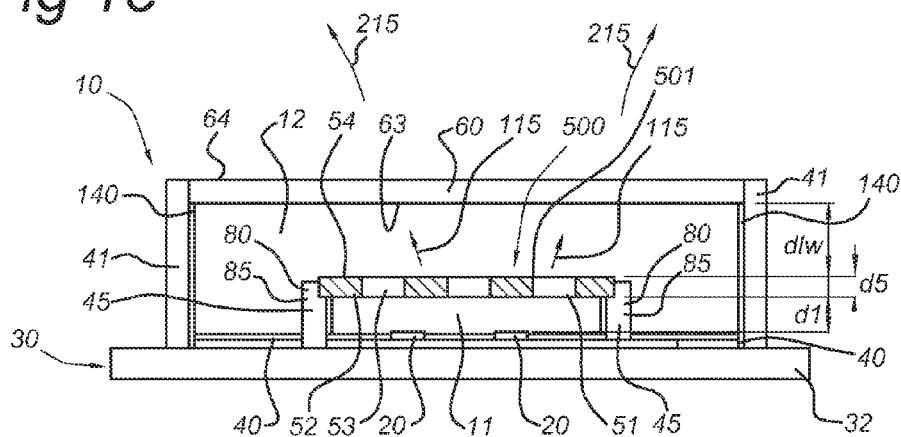

FIG. 1e schematically depicts a similar embodiment as schematically depicted in schematic drawing 1d, with the exception that the upstream surface area of the translucent exit window 60 is larger than the upstream surface area of the self-supporting grid 500. Particularly preferred ratios of these surface areas are about $\geq 2$, more particularly in the range of about 3-10. In this embodiment, the diffuser cavity 12 encloses the LED cavity 11; the diffuser cavity 12 is enclosed by the transmissive support 50, the exit window 60, diffuser cavity walls 41, the LED support 30, and LED cavity wall 45.

Figure 1F:
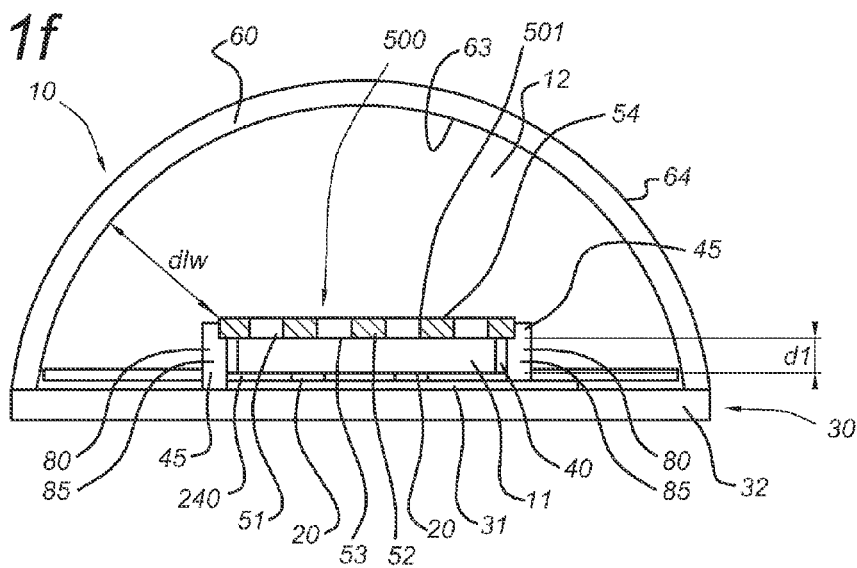

FIG. 1f schematically depicts a similar embodiment as schematically depicted in schematic drawing 1e, with the exception that the translucent exit window 60 is concave. Again, the ratio of the upstream surface area of the translucent exit window and the upstream surface area of the self-supporting grid 500 is larger than 1 (whereas in the embodiments schematically depicted in FIGS. 1c and 1d, this ratio was equal to about 1).

Note that in FIGS. 1c-1d, the diffuser cavity walls 41 and LED cavity walls 45 may be in one piece with each other (i.e. single wall(s) 80). Further, in these schematic drawings of embodiments, part of the grid 500 is integrated in the heat sink 85.

The above described and schematically depicted embodiments are non-limiting. The self-supporting grid 500 and the exit window 60 are (in general) schematically depicted as flat grids or windows. However, other configurations are also possible. For instance, a substantially flat exit window 60 and a non-flat, for instance substantially convex, self-supporting grid 500 may also be an embodiment. Or, a substantially flat self-supporting grid 500 and a non-flat, for instance convex, exit window 60 may be applied.

FIGS. 2a-2f schematically depict (in a top view) embodiments of the self-supporting grid 500. Luminescent material 51 is not depicted, for the sake of understanding.

The grid comprises grid structures, such as wires or plates, especially wires, which make up the grid. The grid may comprise a 1-dimensional grid, a 2-dimensional grid or a 3 dimensional grid. The grid structures may be arranged in an ordered way or in a disordered way, or in a combination thereof. In general, the grid structures will have dimensions like thickness, diameter or height in the range of about 0.01-2 mm, especially in the range of about 0.02-0.5 mm (see also FIGS. 4a and 4b).

The grid openings 502 preferably have dimensions (length/width or diameter) in the range of about 0.1-4 mm, especially in the range of about 0.5-2 mm (indicated as d2, see below).

Figure 2B:
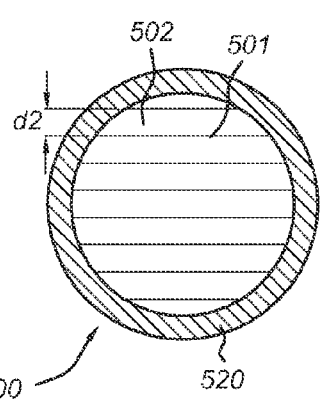
Figure 2C:
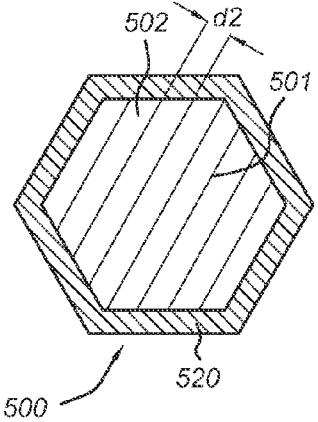

FIGS. 2a-2c relate to 2D grids (with a homogenous distribution of the grid structures 501 (and thus also of the grid openings 502)). The distance between the grid structures is indicated with reference d2. By way of example, a square, circular, and hexagonal shape are schematically depicted (as the LED cavity 11 and the diffuser cavity 12 may have the form of cube, a cylinder, or a hexagon, respectively.) Other shapes are not excluded.

Figure 2D:
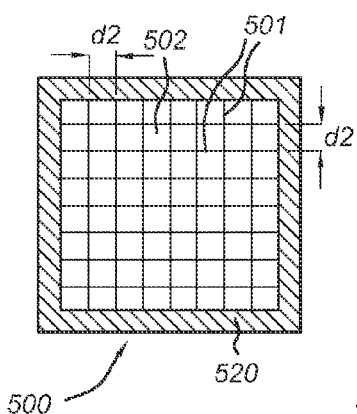
Figure 2E:
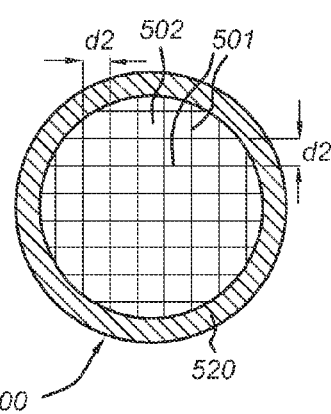
Figure 2F:
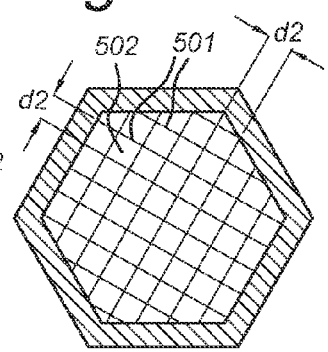

FIGS. 2d-2f relate to 1D grids (with a homogenous distribution of the grid structures 501 (and thus also of the grid openings 502)). The distance between the grid structures is indicated with reference d2. Again, by way of example, a square, circular, and hexagonal shape are schematically depicted. Note that the grid openings 502 are not necessarily square, but may also have other shapes. Hence, the grid openings 502 may have different d2 values (in different directions in the plane of the grid structure 500).

In FIGS. 2a-2f, and also further Figures, the self-supporting grid 500 comprises a frame, enclosing the grid, indicated with reference 520. Preferably, the frame 520 comprises the same material as the grid structures 501, or comprises a material with a higher thermal conductivity.

In FIGS. 2a-2f (and also in the other Figures), the grid 500 has a mean grid pattern density (MPD) defined as the mean number of grid openings per square mm (over the whole grid 500). In these Figures, the local grid pattern density (LPD) is substantially equal to the mean grid pattern density (MPD), since the grid structures 500 are homogeneously distributed over the grid 500.

Figure 3A:
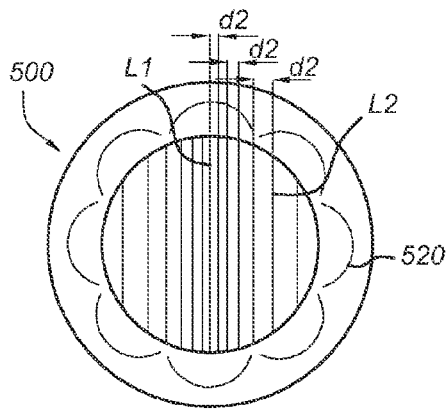
FIGS. 3a-3b schematically depict a non-limiting number of embodiments of 1D and 2D grids in a top view, wherein the grid structures are inhomogeneously distributed.
Figure 3B:
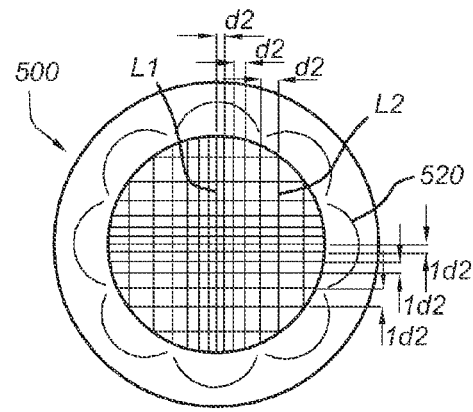

As mentioned above, the self-supporting grid does not necessarily have a homogenous distribution of grid structures 501. Two non-limiting examples are schematically shown in FIGS. 3a and 3b, for a 1D and 2D self-supporting grid 600, respectively. The value of d2 here may differ over the self-supporting grid 600. At locations that may receive a relatively intense LED emission 21 (L1 locations) d2 may be smaller (in one or both dimensions in 2D self-supporting grids 600) than at locations that may receive a relatively less intense LED emission 21 (L2 locations). Thus, here the local grid pattern density (LPD) varies over the grid, being higher than the mean grid pattern density (MPD) at locations L2 and being lower than the mean grid pattern density (MPD) at locations L1. Note that for 3D grids (not depicted herein), the LPD and MPD values are defined with respect to the volume (mm$^3$) instead of per square mm).

Figure 4A:
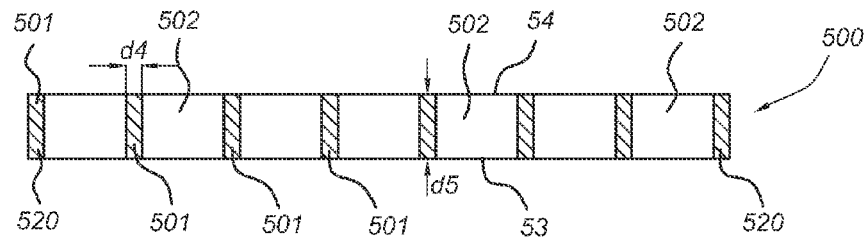
FIGS. 4a-4b schematically depict a non-limiting number of embodiments of grids in a side view.
Figure 4B:
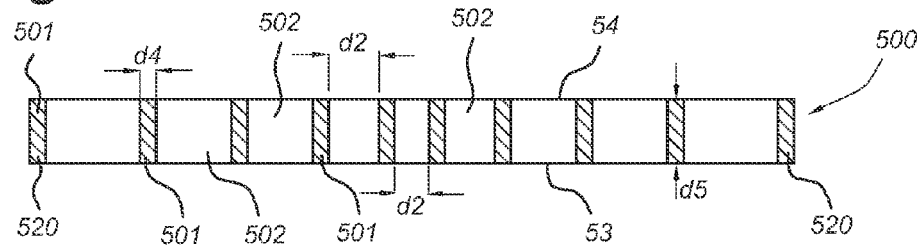

In FIGS. 4a-4b, side views of embodiments of the self-supporting grid 500 are schematically depicted. These may be 1D or 2D self-supporting grids. In FIG. 4a, the grid structures 501, and thus the grid openings 502, are homogeneously distributed, whereas in FIG. 4b, the grid structures are inhomogeneously distributed (not excluding an ordered distribution), wherein the distance d2 between the grid structures 501 varies. In FIG. 4b, the LPD is larger at L2 than at L1. FIGS. 4a and 4b indicate the dimensions of the grid structures 501, like diameter, height and thickness. In FIGS. 4a and 4b, grid structures 501 are schematically drawn which are larger in height (indicated with reference d5) than in thickness (or diameter) (indicated with reference d4). Note that the grid structures 501 may be wires, wherein the "height", thickness and diameter are the same. The length of the grid structures 501 is indicated with d2 (see FIGS. 2a-2f and 3a-3b).

Figure 5A:
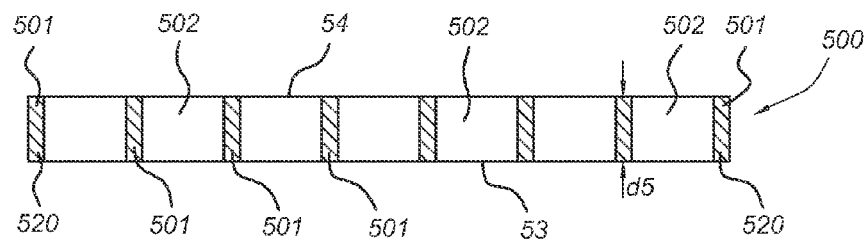
FIGS. 5a-5d schematically depict a non-limiting number of embodiments of grids in a side view with more luminescent material details.
Figure 5B:
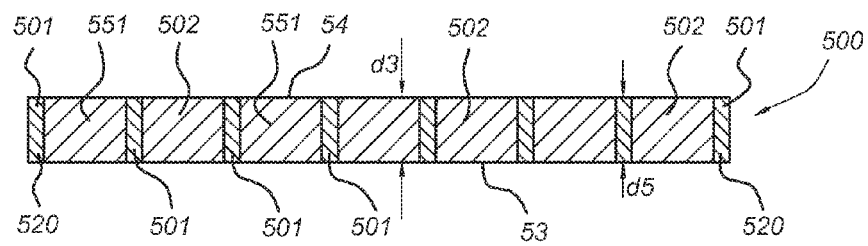

FIGS. 5a-5d schematically depict how the self-supporting grid 500 may be filled with luminescent material 51. FIG. 5a shows for comparison reasons a self-supporting grid 500 not comprising luminescent material. FIG. 5b schematically depicts an embodiment wherein substantially all grid openings 502 enclose luminescent material 51. The filled grid openings are indicated as luminescent material-filled grid openings 551. Hence, in this embodiment substantially all grid openings 502 are luminescent material-filled grid openings 551. The (median) height of the luminescent material 51 enclosed by the grid openings 502 is indicated with reference d3, and may be in the range of about 0.01-2 mm, especially in the range of about 0.02-0.5 mm.

Figure 5C:
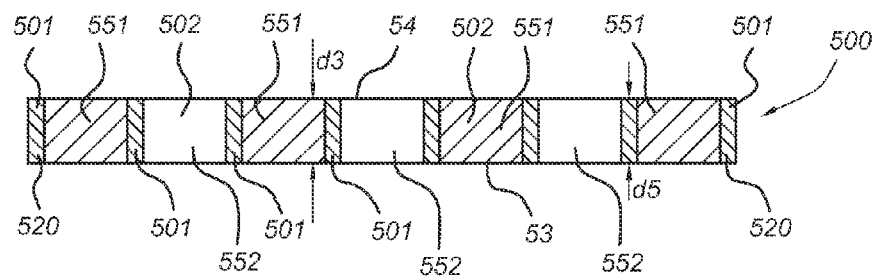
Figure 5D:
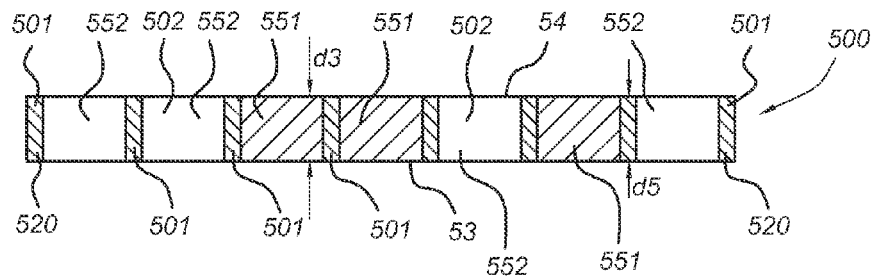

FIG. 5c schematically depicts an embodiment of the self-supporting grid 500, wherein part of the grid openings 502 enclose luminescent material 51, thereby providing luminescent material-filled grid openings 551, and part of the grid openings 502 do not enclose luminescent material 51, and are indicated as non-filled grid openings 552. Hence, FIG. 5c schematically shows an embodiment wherein the self-supporting grid 500 comprises a (regular) pattern of luminescent material-filled grid openings 551 and substantially non-filled grid openings 552. However, such a pattern of filled grid openings 551 and substantially non-filled grid openings 552 may also be irregular, as schematically depicted in FIG. 5d. Likewise, this may apply to grids 500 having an inhomogeneous distribution of the grid structures 501 and grid openings 502.

Figure 6:
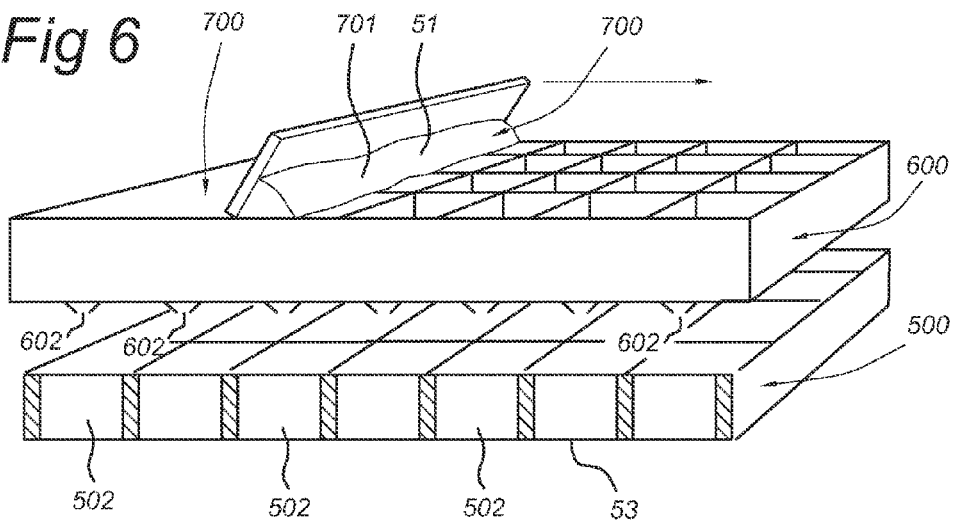
FIG. 6 schematically depicts a schematic embodiment of the method of making the self-supporting grid containing luminescent material.

FIG. 6 schematically depicts an embodiment of a method of making the self-supporting grid 500 filled with luminescent material 51. An embodiment of the self-supporting grid 500, as described herein, is provided. Especially, the optical transmission in the visible part of the grid 500 is at least about 70%, more especially at least about 80%, even more especially at least about 85% (i.e. of the grid 500 before filling it with luminescent material 51 (more particularly before filling it with the paste)). Here, the transmission is measured of the visible light under perpendicular irradiation of the grid 500 with the visible light.

Further, a sieve 600 with a plurality of predetermined sieve openings 602 is provided, wherein the sieve 600 is arrangeable over the self-supporting grid 500.

Herein, the term "arrangeable over" includes arranging the sieve 600 over the self-supporting grid 500, or arranging the self-supporting grid 500 under the sieve 600, or both moving the sieve 600 and the grid 500 to each other to obtain the desired configuration.

Then, a paste 700 comprising luminescent material 51 and a binder 701, and optionally other materials (like one or more of solvents, stabilizers, scattering particles) is guided through the plurality of predetermined sieve openings 602, thereby filling predetermined grid openings 502. After the (predetermined) grid openings 502 have been filled, the self-supporting grid 500 with the paste 700-filled predetermined grid openings 502 is heated (by IR heating or other methods of heating known to the person skilled in the art), thereby providing the self-supporting grid 500 with luminescent material-filled grid openings 551.

In particular, the paste 700 has a viscosity larger than about 1 Pa·s (at a shear rate of $1\ s^{-1}$ and at a temperature of 20° C.). The paste has a preferred viscosity in the range of 1 to 5,000 Pa·s, preferably between 5 and 1,000 Pa·s, even more preferably between 20 and 400 Pa·s (at a shear rate of $1\ s^{-1}$ and at a temperature of 20° C.). The viscosity is in particular a steady shear viscosity as determined by rotational rheometry using a plate-plate geometry according to DIN 53018-1 under the following conditions:

a gap width of 2 mm at 25 mm plate diameter, and
a shear rate of $1\ s^{-1}$, and
a temperature of 20° C.; wherein, preferably, during 10 s before determining the viscosity a pre-shear is applied at a shear rate of $1\ s^{-1}$ and at a temperature of 20° C.

EXAMPLE

A metal mesh (made of brass, optical transmission of 70%) was coated (impregnated) with YAG phosphor in organic binder (Neocryl). The phosphor load was 90 g/m² (the load on the surface irradiated by the blue LEDs amounts to about 70%×90 g/m²=63 g/m²). This phosphor screen was placed on a 455 nm LED test fixture (comprising a heat sink).
An organic film with luminescent material with YAG was also placed on the same test fixture. The phosphor load of the lumifilm was also about 63 g/m².

The lumifilm reached a peak temperature of 140° C. The phosphor-coated metal mesh however reached a peak temperature of 110° C. It is very likely that optimization of the metal mesh (the use of metal with higher thermal conductivity, f.i. copper) and optimization of the thermal contact of the metal mesh with the fixture result in even larger temperature differences.

The term "substantially" used herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The devices referred to herein are amongst others described during operation. For instance, the term "blue LED" refers to an LED which during operation thereof generates blue light; in other words: the LED is arranged to emit blue light. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The term "comprise" includes also embodiments wherein the term "comprises" means "consists of". The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:
1. An illumination device comprising:
   a. at least one light emitting diode (LED) arranged to emit LED emission;
   b. a heat sink;
   c. a self-supporting grid arranged downstream of the LED in contact with the heat sink, wherein the self-supporting grid comprises a plurality of grid structures defining a plurality of grid openings of varying density between the grid structures, at least one opening of the plurality of grid openings containing luminescent material therein, thereby forming a luminescent material-filled grid opening, wherein the luminescent material is arranged to absorb at least part of the LED emission and emit luminescent material emission, and wherein the LED and the luminescent material are arranged to provide light of a predetermined color downstream of the self-supporting grid.

2. The illumination device according to claim 1, wherein the grid structures are substantially homogeneously distributed over the self-supporting grid.

3. The illumination device according to claim 1, wherein the self-supporting grid has a mean grid pattern density (MPD) defined as the mean number of grid openings per square mm, wherein the intensity of LED emission received by the self-supporting grid is inhomogeneously distributed over the self-supporting grid, and wherein the self-supporting grid is arranged to provide a local grid pattern density (LPD) that is larger than the mean grid pattern density (MPD) at a high intensity location (L1) where the self-supporting grid receives a relatively high intensity of LED emission and arranged to provide a local grid pattern density (LPD) that is smaller than the mean grid pattern density (MPD) at a low intensity location (L2) where the self-supporting grid receives a relatively low intensity of LED emission.

4. The illumination device according to claim 3, wherein the self-supporting grid comprises a regular pattern of luminescent material-filled grid openings and substantially non-filled grid openings (552).

5. The illumination device according to claim 3, wherein substantially all grid openings are luminescent material-filled grid openings.

6. The illumination device according to claim 1, wherein the grid structures comprise a material having a thermal conductivity of at least 100 W·m$^{-1}$ K$^{-1}$ at 300 K.

7. The illumination device according to claim 1, having a shortest LED-self-supporting grid distance (d1) between the LED and the self-supporting grid, wherein the shortest LED-self-supporting grid distance (d1) is in the range of 0-100 mm.

8. The illumination device according to claim 1, further comprising a translucent exit window, downstream of the self-supporting grid, arranged so as to transmit at least part of the light.

9. A method of making the self-supporting grid containing luminescent material according to claim 1, comprising:

a. providing the self-supporting grid comprising the plurality of grid structures and the plurality of grid openings between the grid structures;
b. providing a sieve with a plurality of predetermined sieve openings, wherein the sieve (600) is arrangeable over the self-supporting grid;
c. guiding a paste comprising luminescent material and a binder through the plurality of predetermined sieve openings and filling predetermined grid openings;
d. heating the self-supporting grid with the paste filled predetermined grid openings, thereby providing the self-supporting grid with luminescent material-filled grid openings.

* * * * *